US007308669B2

(12) United States Patent
Buehler et al.

(10) Patent No.: US 7,308,669 B2
(45) Date of Patent: Dec. 11, 2007

(54) USE OF REDUNDANT ROUTES TO INCREASE THE YIELD AND RELIABILITY OF A VLSI LAYOUT

(75) Inventors: Markus T. Buehler, Weil im Schoenbuch (DE); John M. Cohn, Richmond, VT (US); David J. Hathaway, Underhill, VT (US); Jason D. Hibbeler, Williston, VT (US); Juergen Koehl, Weil im Schoenbuch (DE)

(73) Assignee: International Business Machines Corporation, Armonk, NY (US)

( * ) Notice: Subject to any disclaimer, the term of this patent is extended or adjusted under 35 U.S.C. 154(b) by 386 days.

(21) Appl. No.: 10/908,593

(22) Filed: May 18, 2005

(65) Prior Publication Data

US 2006/0265684 A1    Nov. 23, 2006

(51) Int. Cl.
*G06F 17/50* (2006.01)
(52) U.S. Cl. ............................. 716/13; 716/14; 716/16; 716/18; 716/9; 716/10
(58) Field of Classification Search .................... 716/9, 716/10, 13, 14, 16, 18
See application file for complete search history.

(56) References Cited

U.S. PATENT DOCUMENTS

| | | | | |
|---|---|---|---|---|
| 4,615,011 A | * | 9/1986 | Linsker | ........................ 716/13 |
| 4,831,725 A | | 5/1989 | Dunham et al. | |
| 5,500,804 A | * | 3/1996 | Honsinger et al. | ............ 716/16 |
| 5,798,937 A | | 8/1998 | Bracha et al. | |
| 6,006,024 A | * | 12/1999 | Guruswamy et al. | ......... 716/12 |
| 6,026,224 A | * | 2/2000 | Darden et al. | ................ 716/10 |
| 6,066,179 A | * | 5/2000 | Allan | ............................. 716/4 |
| 6,209,123 B1 | * | 3/2001 | Maziasz et al. | ............... 716/14 |
| 6,247,853 B1 | * | 6/2001 | Papadopoulou et al. | ....... 716/4 |
| 6,317,859 B1 | * | 11/2001 | Papadopoulou | ................ 716/4 |
| 6,349,403 B1 | * | 2/2002 | Dutta et al. | .................. 716/12 |
| 6,629,308 B1 | * | 9/2003 | Baxter | ......................... 716/16 |
| 6,715,133 B2 | | 3/2004 | Brennan | |
| 7,047,513 B2 | * | 5/2006 | Teig et al. | ..................... 716/13 |

(Continued)

OTHER PUBLICATIONS

Kahng et al., "Non-tree Routing for Reliability and Yield Improvement", IEEE/ACM International Conference on Computer Aided Design, ICCAD 2002, Nov. 10-14, 2002, pp. 260-266.*

(Continued)

*Primary Examiner*—Phallaka Kik
(74) *Attorney, Agent, or Firm*—Gibb & Rahman, LLC; Richard M. Kotulak, Esq.

(57) ABSTRACT

Disclosed is a method and system for inserting redundant paths into an integrated circuit. Particularly, the invention provides a method for identifying a single via in a first path connecting two elements, determining if an alternate route is available for connecting the two elements (other than a redundant via), and for inserting a second path into the available alternate route. The combination of the first and second paths provides greater redundancy than inserting a redundant via alone. More importantly, such redundant paths provide for redundancy when congestion prevents a redundant via from being inserted adjacent to the single via. An embodiment of the method further comprises removing the single via and any redundant wire segments, if all of the additional vias used to form the second path can be made redundant.

40 Claims, 16 Drawing Sheets

U.S. PATENT DOCUMENTS

| | | | |
|---|---|---|---|
| 7,114,141 B1* | 9/2006 | Teig et al. | 716/12 |
| 2003/0106027 A1* | 6/2003 | Brennan | 716/2 |
| 2003/0106028 A1* | 6/2003 | Brennan | 716/2 |
| 2003/0115566 A1* | 6/2003 | Tieg | 716/14 |
| 2003/0229866 A1 | 12/2003 | Allen et al. | |
| 2004/0098680 A1* | 5/2004 | Teig et al. | 716/4 |
| 2005/0050500 A1* | 3/2005 | Allen et al. | 716/10 |
| 2005/0050501 A1* | 3/2005 | Allen et al. | 716/10 |
| 2005/0273746 A1* | 12/2005 | Hetzel et al. | 716/14 |
| 2006/0064653 A1* | 3/2006 | Zhang et al. | 716/2 |
| 2006/0225005 A1* | 10/2006 | Correale et al. | 716/2 |

OTHER PUBLICATIONS

Xu, et al., "Redundant-Via Enhanced Maze Routing for Yield Improvement", 4 pages, Design Automation Conference, vol. 2, Jan. 18-21, 2005, pp. 1148-1151.

Kahng, et al., "Non-Tree Routing for Reliability and Yield Improvement", 18 pages, no date.

* cited by examiner

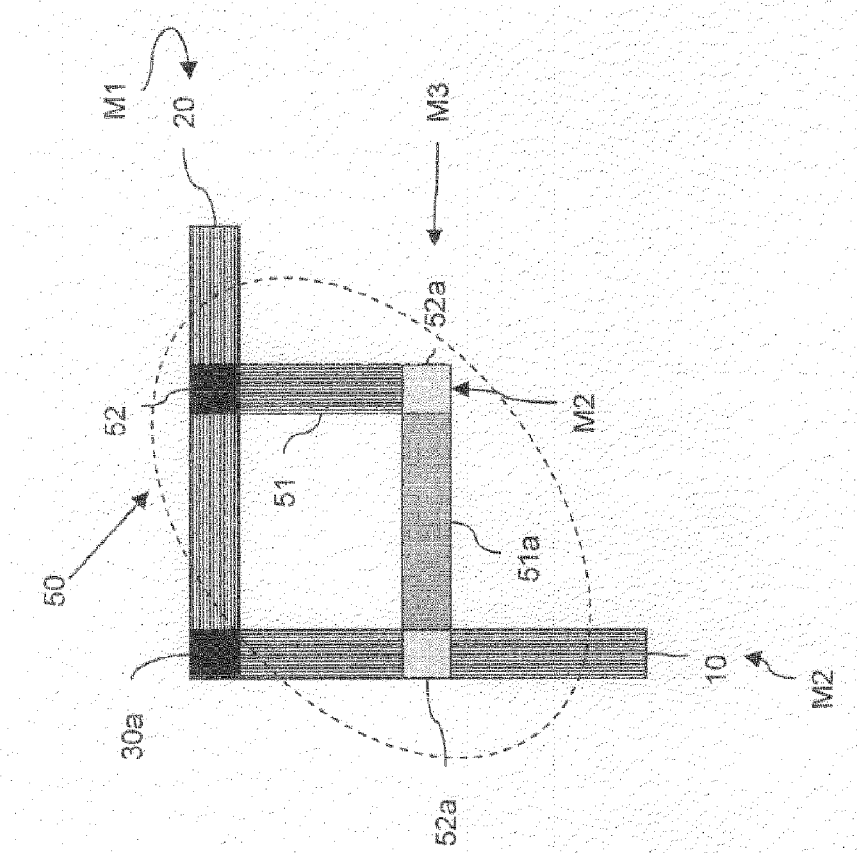
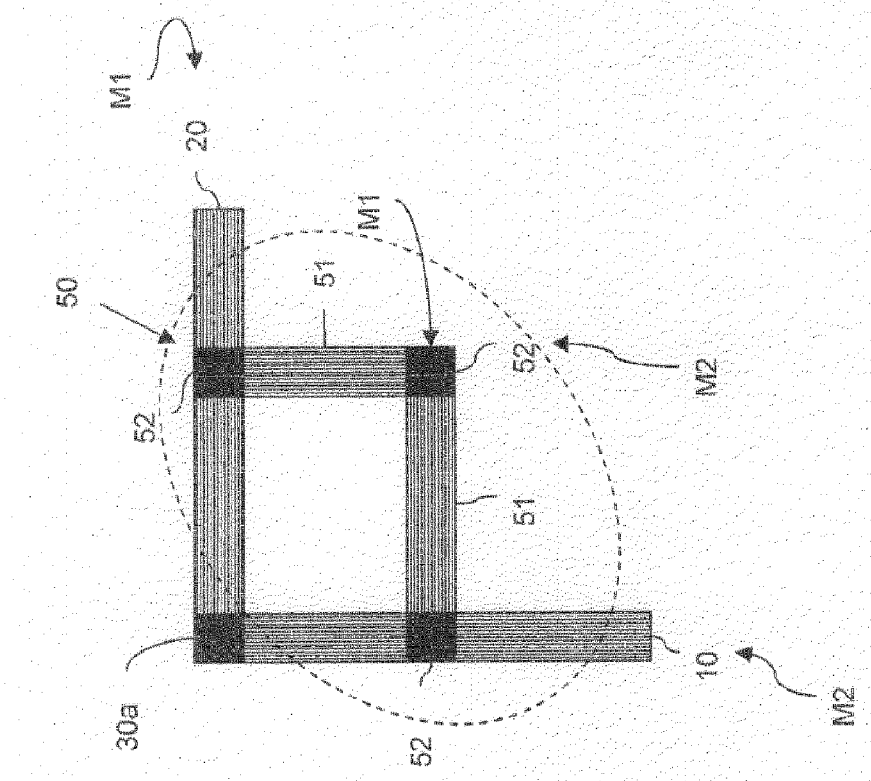
Figure 8b
Figure 8a

USE OF REDUNDANT ROUTES TO INCREASE THE YIELD AND RELIABILITY OF A VLSI LAYOUT

FIELD OF THE INVENTION

The invention relates to integrated circuits and in particular, to a method for increasing redundancy in routed very large scale integration (VLSI) designs in order to enhance circuit reliability.

DESCRIPTION OF THE RELATED ART

As the physical dimensions of very large scale integrated circuits (VLSI) continue to shrink, it has become increasingly difficult to manufacture such integrated circuits reliably. The sensitivity of a VLSI design to random defects increases as feature widths and spacing between features grow smaller. In addition, the presence of single vias (i.e., inter-layer connectors through a single via) is particularly undesirable. From the perspective of random-defect yield, a single via is especially likely to cause a chip failure because a spot defect landing on a single via will create an open circuit. From the perspective of systematic yield, if vias are difficult to manufacture in a given process, then a poorly created single via can cause a circuit open or a highly resistive connection, which could cause a circuit to fail for timing reasons. New manufacturing processes are particularly sensitive to yield problems with vias.

A technique for increasing the quality of via connections in a VLSI layout is by adding redundant vias, either as part of the routing step or as a separate post-routing step. U.S. Pat. No. 6,026,224 to Darden et al., issued on Feb. 15, 2000 (incorporated herein by reference) discloses post-routing methods of inserting redundant vias by employing a local search to find a free space in a wiring track adjacent to the single via in one or both metal planes in order to add a redundant via between the metal planes. Other methods for forming redundant vias may push wires adjacent to the single via aside to create a space in the adjacent wiring track within which a redundant via may be added. Kahng et al., "Non-tree Routing for Reliability and Yield Improvement", IEEE/ACM International Conference on Computer Aided Design, ICCAD 2002, 10-14 Nov. 2002, pp. 260-266. (incorporated herein by reference) presents a technique for adding non-tree routing to a VLSI design to increase yield and reliability. However, often these standard approaches will fail to add a redundant via because the existing single via is located in a congested area in which free spaces are not available, nor can they be made available.

SUMMARY OF THE INVENTION

This invention provides an automated method for reducing integrated circuit design sensitivity to manufacturing defects and increasing integrated circuit reliability by using existing router technology (e.g., routing programs) to increase redundancy of inter-layer connectors (i.e., vias) and intra-layer connectors (e.g., wire segments) in order to enhance circuit reliability and yield. Once the initial routing is completed, single vias (i.e., a single via used to make an inter-layer connection) are identified. Then, a specific single via is selected and temporarily blocked. Specifically, the selected single via is marked within the routing program as not available for connecting a first element (e.g., a wire, pin, device, etc.) to a second element (e.g., a wire, pin, device, etc.). The single via is also preferably coded as "must keep" so that the routing program will not remove the original single via in order to form another path. Then, the existing routing program identifies an available alternate route for a connection between the first and second elements and inserts a second path therein. The second path comprises a loop that extends from the first element to the second element and comprises at least one additional via and an additional intra-layer connector (e.g., wire segment). Once the second path is inserted, the single via is unblocked. Thus, the first element and the second element are connected by both first and second paths (i.e., redundant paths). The process is repeated for each single via identified. These redundant paths are used to reduce the integrated circuit's sensitivity to manufacturing defects that may be caused by a potential block in the single via.

It should be noted that the present invention need not be limited to the wiring layers in an integrated circuit. Non-redundant connections to the layers that form devices (e.g., transistors) can also be treated using the techniques described herein.

Limitations may be placed on the process of inserting a second path. For example, one limitation may be that the second path may only be inserted if it is located within and between those metal layers used by the first path. Another limitation may be that the second path may only be inserted if is inside a predetermined distance from the single via and/or it is outside another predetermined distance from said single via. Yet another limitation may be that any previously existing redundant vias must be maintained when inserting a second path. In addition, a cost-benefit analysis may be conducted to determine if a benefit of inserting the second path outweighs a cost associated with inserting the second path. Inserting a redundant path (i.e. a second path) reduces the probability that an open circuit fault will occur by reducing the open circuit fault critical area within the integrated circuit (e.g., within the integrated circuit wiring), but also increases the probability of a random short circuit fault by increasing the short circuit fault critical area in the integrated circuit (e.g., within the integrated circuit wiring). In order to conduct the cost-benefit analysis a value of the benefit of avoiding a defect caused by the potential block in the single via and of reducing the open circuit fault critical area is estimated. The value of the benefit is estimated by measuring a length of redundancy which will be created by the second path, by subtracting the length of the redundancy from the open circuit fault critical area, and by applying a predetermined defect density vector for the manufacturing process. A value of the cost of increasing the short circuit fault critical area is also estimated. The value of the cost is estimated by measuring a length of adjacency between wire segments of the second path and previously existing wire segments, by adding the length of adjacency to the short circuit critical area, and by applying a predetermined defect density vector for the manufacturing process. The value of the cost is compared to the value of the benefit and the second path is only inserted if the benefit outweighs the cost.

Another embodiment of the method of the present invention comprises the same processes as the embodiment described above; however, after routing the intra-layer connectors (e.g., wire segments) and inter-layer connectors (i.e., vias), redundant vias are inserted wherever possible in the integrated circuit. Redundant vias may be inserted using prior art methods, for example, by using local geometry methods to insert a redundant via into an open space adjacent a single via. Once redundant vias are inserted, then the remaining single vias are identified. The remaining single vias are those vias which could not be made redundant because they are located in a congested area without an open space adjacent to them (either initially or by moving a net) sufficient for inserting a redundant via.

Another embodiment of the method of the present invention also comprises the same processes as the embodiments described above; however, upon inserting the second path, additional redundant vias are inserted wherever possible in the second path adjacent to the additional vias. If, after inserting the redundant vias, the additional vias all are redundant, then the original via and any redundant intra-layer connectors (e.g., wire segments) formed during the process can optionally be permanently removed. If on the other hand, after inserting the redundant vias, at least one of the additional vias is still single (i.e., non-redundant), then the single via is unblocked such that the first path and the second path provide redundant paths between the first element and the second element.

This invention also provides a system for reducing sensitivity to manufacturing defects and increasing reliability in integrated circuit inter and intra-layer connections. The system comprises a router for identifying available routes and for inserting intra-layer connectors (e.g., wire segments) and inter-layer connectors (i.e., vias) into the available routes to form connecting paths. An identifier identifies single vias in previously routed connecting paths, e.g., a single via in a first path connecting a first element (e.g., wire, pin, device, etc.) and a second element (e.g., wire, pin, device, etc.). A diverter blocks a selected single via so that it is not recognized by the router as a connection between a first element and second element. The diverter must also make sure that the router does not remove possibly created antennas, e.g. by setting all remaining connections of the net to "must keep." In other words, the diverter tricks the router into proceeding as if the single via is not available for use in connecting the first element to the second element. The router is further adapted to determine an alternate path (i.e., second path) for connecting a first element and a second element when the single via is blocked and for inserting the path. The diverter is further adapted for unblocking the selected single via once the second path is inserted such that the first path and the second path provide redundant paths between the first element and the second element. A controller controls the router by placing limitations on the second path which may be used. For example, the controller may be adapted to restrict the second path to within an area between and within the metal layers used by the first path and/or to within a predetermined distance from the single via. The controller may also restrict the router from ripping up existing vias in order to form the second path. Additionally, the controller may be adapted to conduct a cost-benefit analysis and to only insert the second path if a benefit of inserting the second path outweighs a cost of inserting the second path.

Therefore, the invention provides a method for inserting redundant paths into integrated circuit wiring. A redundant path provides greater redundancy than a redundant via alone. Additionally, a redundant path provides for redundancy when congestion prevents a redundant via from being inserted. This redundancy enhances circuit yield and reliability by reducing the probability of failures due to random defects. These, and other, aspects and objects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE DRAWINGS

The invention will be better understood from the following detailed description with reference to the drawings, in which:

FIGS. 8a-8b illustrate an exemplary embodiment of the method of the invention;

DETAILED DESCRIPTION OF PREFERRED EMBODIMENTS OF THE INVENTION

Figure 1:
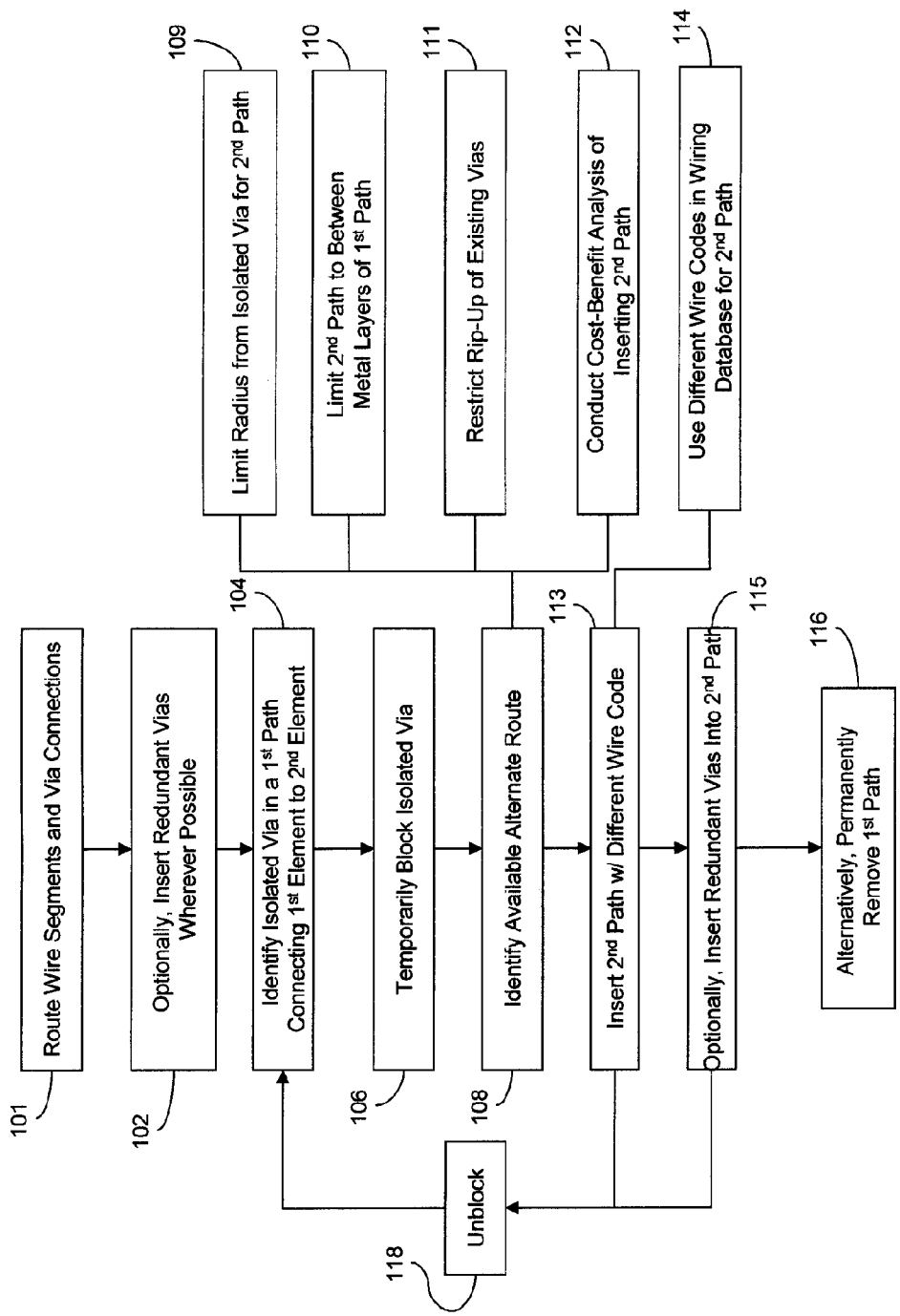
FIG. 1 is a flow diagram illustrating a method of the invention.

The present invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

The invention relates to integrated circuits and, in particular, to a method for increasing redundancy in routed very large scale integration (VLSI) designs in order to enhance circuit yield and reliability. The method can be used in conjunction with an existing routing program. Additionally, the method can be used in conjunction with an existing redundant-via insertion program or alternatively by itself to and redundancy. The invention provides a method for inserting redundant paths into integrated circuit wiring and particularly for inserting a redundant path between two metal segments that meet at a single via. A redundant path provides greater redundancy than inserting a redundant via alone. Additionally, a redundant path provides for redundancy when congestion prevents a redundant via from being inserted adjacent to a single via. This redundancy enhances circuit yield and reliability by reducing the probability of failures due to random defects. For illustration purposes the present invention is described as providing redundancy to inter and intra layer connectors within the wiring layers; however, those skilled in the art will recognize that the invention need not be limited to the wiring layers. For example, the invention may be used to form redundant connectors between active layers and between active layers and metal layers.

Referring to FIG. 1, this invention provides an automated method for reducing sensitivity to manufacturing defects and increasing reliability in integrated circuit wiring by using existing router technology (e.g., routing programs) in order to enhance circuit yield and reliability by adding redundant paths. An embodiment of the method comprises routing the intra and inter layer connectors (e.g., wire segments and vias) of an integrated circuit using a prior art routing program (101, see FIG. 2). The invention is described and illustrated herein with regard to a gridded wiring design for exemplary purposes only. Those skilled in the art will recognize that the invention may be practiced with any suitable wiring design methodology now available or with any suitable wiring design methodology which may be available in the future. Once, the initial routing at process 101 is completed, single vias 30 (i.e., a single via used to make an interlayer connection) are identified (104). For example, referring to FIG. 2, initial routing can place a first element 10 on a first layer (e.g., a first wire on a first level M1 in a first direction) connected to a second element 20 on a second layer (e.g., a second wire on a second level M2 in a second direction) by way of a single via 30a. This single via 30a comprises the entire first path 40 between the first element 10 and the second element 20. Then, one at a time individual single vias (e.g., single via 30a, 30c, etc.) are targeted for processing. The targeted single via 30a is temporarily blocked (106, see FIG. 3). In other words, the routing program is tricked into proceeding as if the single via 30a is not available for use in connecting the first element 10 to the second element 20. Blocking may be accomplished by functionally blocking the single via 30a or by moving the single via 30a to another net, such as a dummy net. The single via 30a is also preferably coded as "must keep" so that the routing program will not remove the single via 30a in order to form another path. Blocking the single via 30a allows the routing program to identify an available alternate route 70 that may be used for inserting a second path 50 to form the redundant loop connecting the first element 10 to the second element 20 (108). Alternatively, the single via 30a may simply be coded with a high cost for retention, so that the routing program will try to find another route for connecting the two elements.

Figure 2:
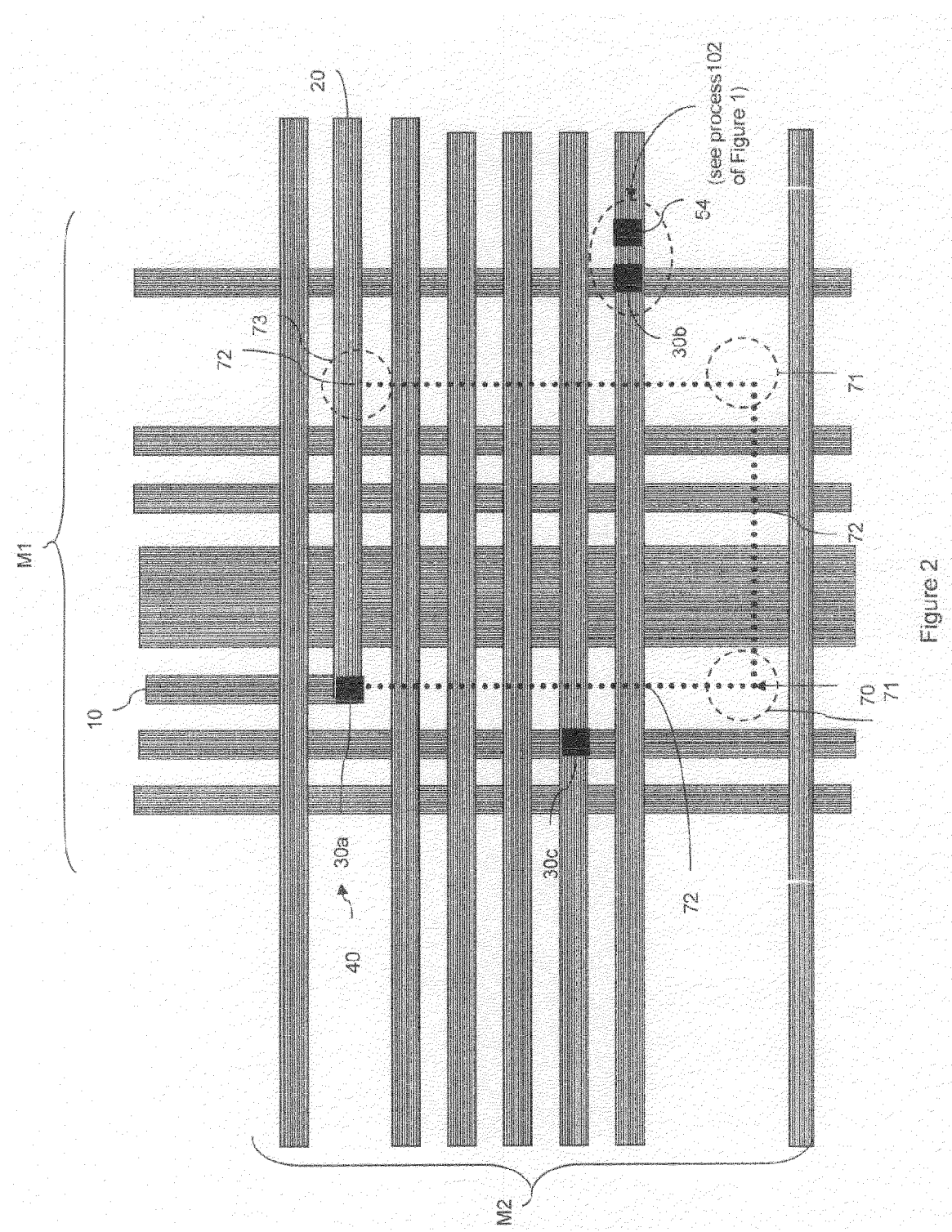
FIG. 2 illustrates a top view of two levels of integrated-circuit wiring with a single via as a first path connecting a first wire in a first direction and a second wire in a second direction.
Figure 3:
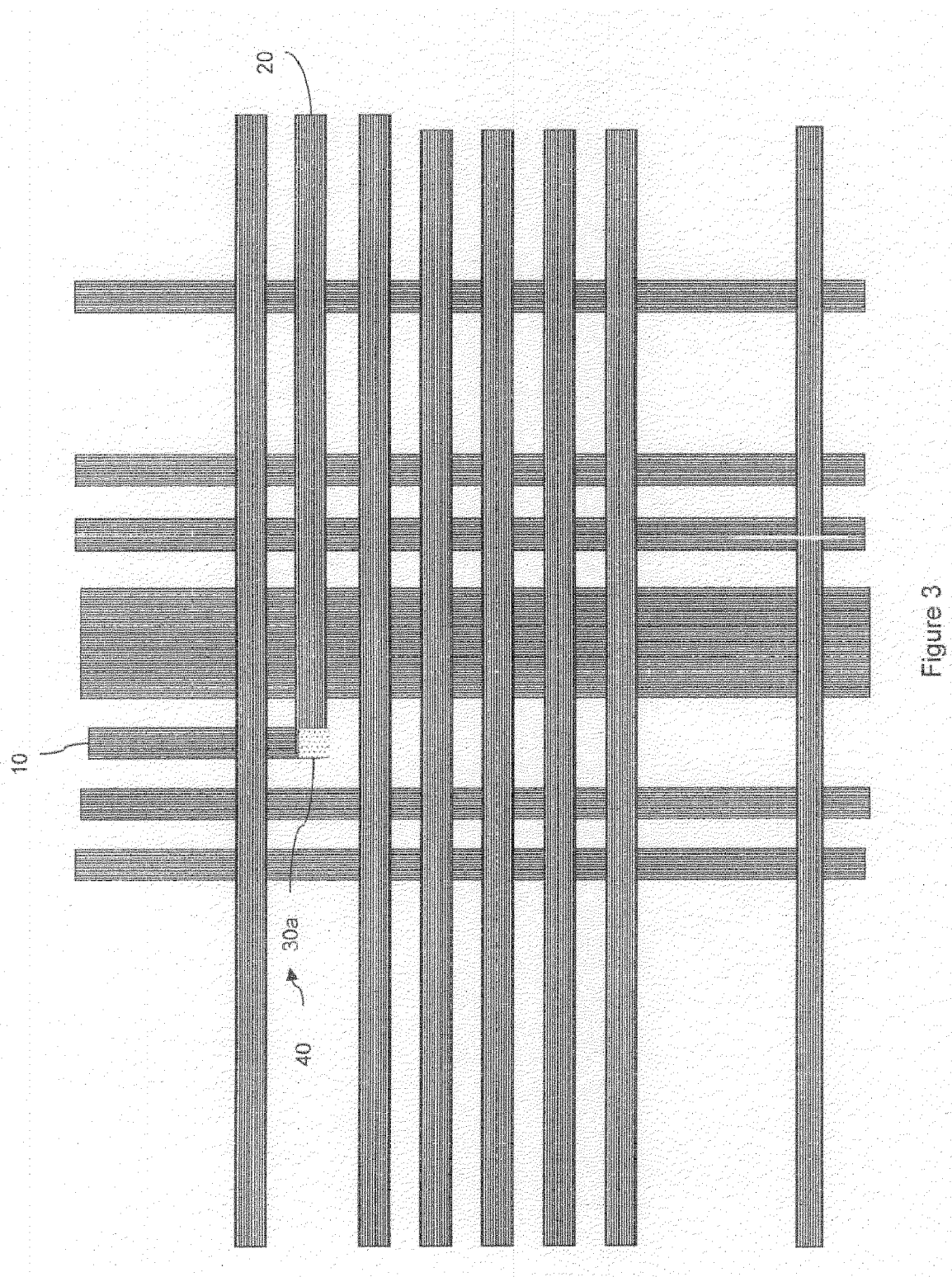
FIG. 3 illustrates FIG. 2 with the single via blocked.
Figure 4:
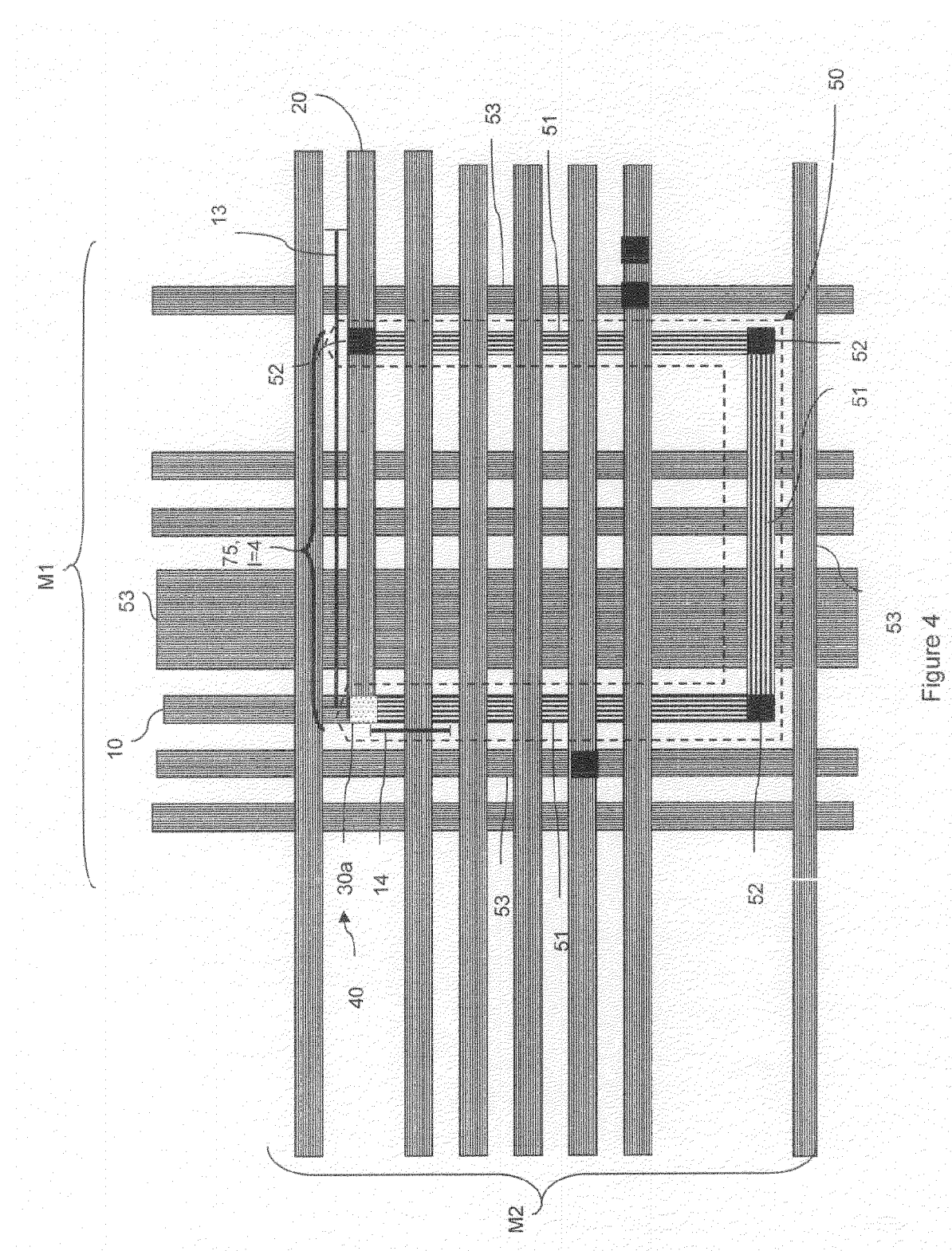
FIG. 4 illustrates FIG. 3 with a second path connecting the first wire and the second wire.

Referring to FIG. 2, at process 108 an available alternate route 70 (i.e., a new legal route) for connecting the first element 10 to the second element 20 is identified by the routing program. If such an available route 70 is identified, the routing program inserts the additional via(s) 52 and intra-layer connectors (e.g., wire segments) 51 into the available route 70 to form the second path 50 (113). For example, the routing program may insert additional vias 52 into the open grid points 71 and at location 73 and the additional wire segments 51 into the open channels 72 in order to form the second path 50 (see FIG. 4). Specifically, additional vias 52 may be inserted at position 73 where a new segment 51 meets the first or second wire 20 and at position 71 where additional wire segments 51 meet each other. The second path 50, therefore, comprises a loop with additional via(s) 52 (e.g., three additional vias 52, as illustrated in FIG. 4) and additional wire segments 51 (e.g., three additional wire segments 51, as illustrated in FIG. 4).

Note that adding redundancy may cause ground rule violations such as limits on the minimum enclosed area. Thus, when inserting the second path 50 at process 113, different wire codes in the wiring database should be used for the additional vias 52 and wire segments 51 (114), so that these additional vias 52 and wire segments 51 can be selectively removed in situations where ground rule violations occur.

Figure 5:
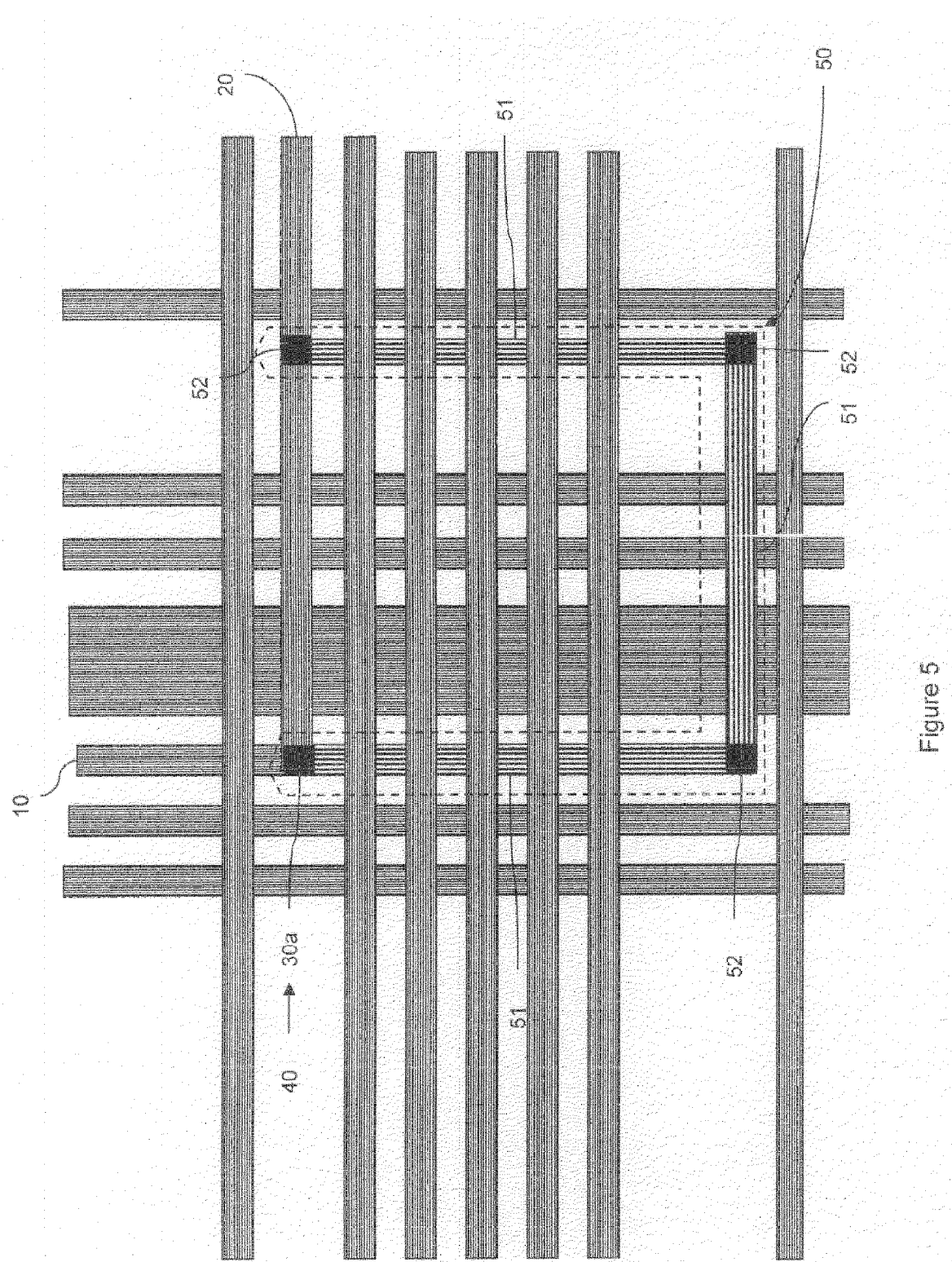
FIG. 5 illustrates FIG. 4 with the single via unblocked.

After the second path 50 is inserted at process 113, the single via 30a is unblocked (118, see FIG. 5). Thus, the first element 10 and the second element 20 are connected by both first path 40 and second path 50, thereby forming redundant paths. The process is repeated for each of the single vias (e.g., 30c, etc) that is identified at process 104. The redundancy that is created by both vias and any redundant intra-layer connectors (e.g., wire segments) avoids random defects in the integrated circuit inter and intra-layer connections (e.g., defects that may be caused by potential blocks in the single via 30a or potential open circuit faults in the wire segment 75).

Limitations may be placed on the process 108 of inserting a second path 50. For example, limitations may be placed on the process 108 so that arbitrarily long second paths 50 are not formed. Limitations may also be placed on the process 108 because an additional via 52 placed too close to the target single via 30a increases the fault correlation between the additional via 52 and the targeted single via 30a and thus adds less robustness to the wiring design than if the redundant via were placed farther away from the targeted single via 30a.

For example, a limitation may be that the second path 50 may only be inserted within a certain range (i.e., inside a predetermined distance 13 from the blocked single via 30a and/or outside a second predetermined distance 14 from the blocked single via 30a) (110). A redundant path 50 with a greater distance from the single via 30a will reduce the fault correlation but the redundant path 50 should still be kept close enough to the single via 30a to avoid timing analysis problems. Such problems can occur because the added capacitive load of the redundant path can increase the delay of the gate driving the net, and limiting the length of the redundant path will limit load increase. Similarly, another limitation may be that the second path 50 may only be inserted into an area within and between those metal layers (e.g., M1 and M2) used by the first path 40 (109). However, referring to FIG. 8a, the robustness of the redundancy is reduced when the fault probabilities of the targeted single via 30a and the additional single vias 52 of redundant paths 40, 50 are correlated because the additional intra-layer connectors 51 (e.g., wire segments) and the additional vias 52 serve to connect two first layer elements (e.g., two level M1 wires) with two second layer elements (e.g., two level M2 wires). Since via faults on different layers are not correlated, thereby, making redundancy much more robust, it may be advisable to place the additional vias 52 on a layer pair that is different to the one that is used for the target single via 30a. For example, referring to FIG. 8b, the robustness of the redundancy is increased if the second path 50 contains an additional second direction wire segment 51a and the associated additional vias 52a on another metal wiring level M3. Placing the additional single vias 52a on a different level M3 breaks the correlation, thus, M1/M2 and M2/M3 via faults are not correlated. Another limitation on the process 108 of inserting a second path 50 may be that any previously existing vias (e.g., the blocked single via 30a or any other vias (e.g., 30c, 30b, 54, etc.) must be maintained (i.e., not ripped-up) (111). Yet another limitation on the process 108 may be that a cost-benefit analysis is conducted and a second path 50 is only inserted if the benefit of inserting the second path 50 outweighs a cost associated with inserting the second path 50 (112).

The open-circuit critical area of a VLSI design is a mathematical measure of the sensitivity of the design to random defects that cause an open circuit (i.e., defects that cut a wire). The short-circuit critical area is a measure of the sensitivity of a design to random defects that cause a short circuit by simultaneously touching two shapes on different electrical nets. Critical area measurements can be used to predict yield. Inserting a redundant path (i.e. a second path 50) reduces the probability of a random open circuit fault from occurring by reducing the open circuit fault critical area within the integrated circuit, but also increases the probability of a random short circuit fault by increasing the short circuit fault critical area in the integrated circuit wiring. In order to conduct the cost-benefit analysis at process 112 a value of the benefit of avoiding a random defect caused by the potential block in the single via and of the reducing of the open circuit fault critical area is estimated. Referring to FIG. 4, for example, the value of the benefit can be estimated by first measuring a length of redundancy 4 on layer M2, which will be created by the second path 50. The length of redundancy 4 is equal to the length of a segment 75 of the first wire 10 and/or the second wire 20 also being made redundant. Then, the length of redundancy 4 can be subtracted from the open circuit fault critical area and a predetermined defect density multiplication factor for the manufacturing process can be applied. Critical area for opens and critical area for shorts are combined during yield prediction by multiplying each value by a weighting factor representing the estimated incidence of shorts and opens defects. This weighting factor is referred to as the defect density vector. Additionally, a value of the cost of increasing the short circuit fault critical area can also be estimated. The value of the cost is estimated by measuring a length of adjacency between wire segments 51 of the second path 50 and previously existing adjacent wire segments 53. This length of adjacency is added to the short circuit fault critical area and a predetermined defect density multiplication factor for the manufacturing process is applied. Then, the estimated value of the cost is compared to the value of the benefit and the second path 50 is only inserted if the benefit outweighs the cost.

More particularly, the cost-benefit analysis at process 112 makes a trade-off between the length of new wire segments 51 added and the cost of a leaving a via as a single via 30a. As a second path 50 is constructed, this trade-off involves an increase in the likelihood of random-defect shorts that are caused by an increase in shorts critical area between existing wire and new wire, a decrease in the likelihood of random-defect opens because an open in any part of the original circuit that has been made redundant will no longer cause an electrical open, and a decrease in the likelihood of random-defect via block because the single via itself is being made redundant. The cost weights for each of these three quantities can be readily obtained by using the defect density densities for the manufacturing process. For example, referring to FIG. 4, the cost-benefit analysis 112 of the method estimates the increase in shorts critical area by counting the length of single-channel adjacency on metal levels M1 and M2 of the proposed new segments 51. The method estimates the reduction in opens critical area by counting the length of the parts of first wire 10 and second wire 20 that have been made redundant through the new path 50. The method computes the net cost of adding the proposed new path 50 by adding the estimated additional shorts critical area, subtracting the estimated additional opens critical area, and subtracting the cost of the single via 30a. If the net cost is negative, the invention accepts the new path 50, and adds it to the wiring. If the net cost is positive, the invention leaves the target via single and goes on to target another single via.

Additionally, the cost-benefit analysis at process 112 may further include placing a first predetermined cost on the single via and a second predetermined cost of creating each additional via. Then, an available route 70 is identified at process 108 by identifying available points on the wires leading to the single via and creating the circuit using as few vias as possible and only re-using the single via 30a if necessary. Thus, a second path 50 is inserted into the available alternate route 70 only if a sum of the second predetermined costs (of adding each additional via) is less than the first predetermined cost of retaining the single via.

Referring again to FIG. 1, another embodiment of the method of the present invention comprises the same processes as described above; however, optionally, after routing the intra-layer connectors (e.g., wiring) and inter-layer connectors (e.g., vias) at process 101, redundant vias 54 are inserted wherever possible next to single vias (102, e.g., see single via 30b of FIG. 2). Redundant vias 54 may be inserted using prior art post-routing methods of inserting redundant vias, such as by using local geometry methods to insert a redundant via 54 into an available open space adjacent to a single via (e.g., 30b). For example, redundant vias may be inserted globally, as described in U.S. Pat. No. 6,026,224 cited above, or by any other prior art method. Once redundant vias 54 are inserted adjacent to a single via 30b, then any remaining single vias 30a are identified (104). The remaining single vias 30a are those vias which could not be made redundant because they are located in a congested area (i.e., they do not have an open space adjacent to them sufficient for inserting a redundant via 54, nor could such a space be made available by moving aside a net).

Figure 6:
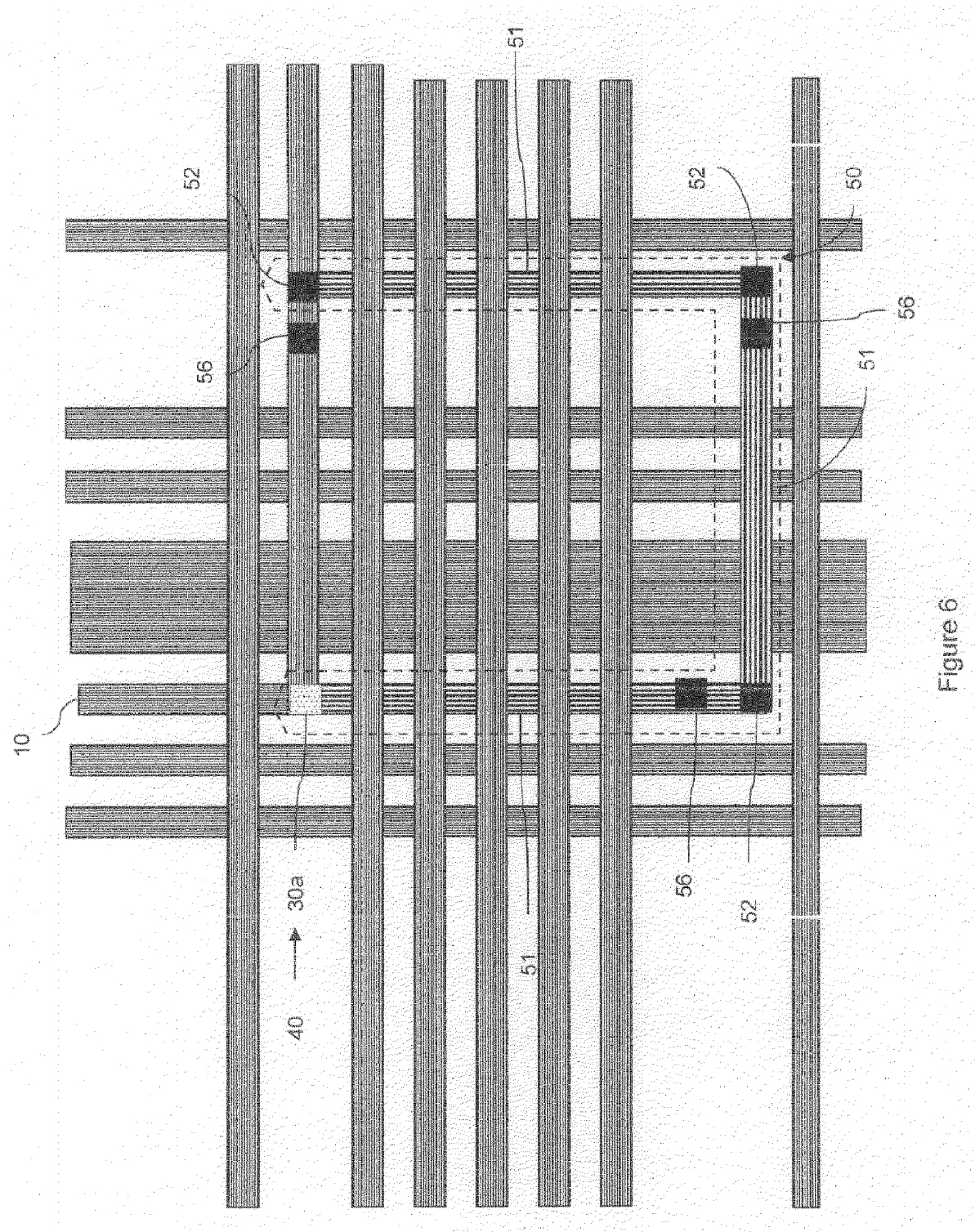
FIG. 6 illustrates FIG. 4 with additional vias in the second path made redundant.
Figure 7:
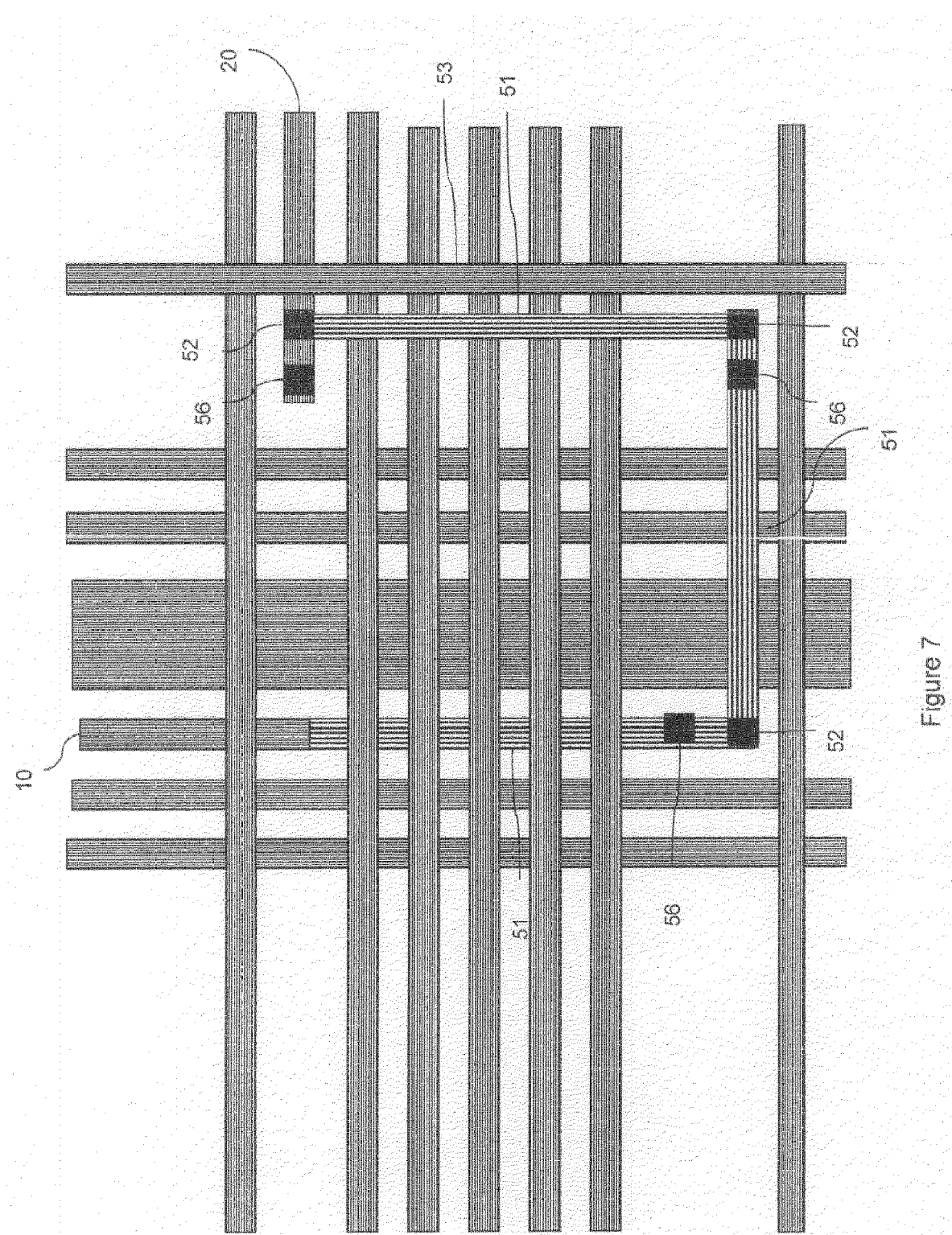
FIG. 7 illustrates FIG. 6 with the first path removed.

Referring again to FIG. 1, another embodiment of the method of the present invention also comprises the same processes as the embodiments described above; however, upon inserting the second path 50 at process 113, additional redundant vias 56 are inserted wherever possible in the second path 50 adjacent to corresponding single additional vias 52 (115, see FIG. 6). Additional redundant vias 56 may be inserted by using prior art post-routing methods, such as by using local geometry methods to insert a redundant via 56 into an open space adjacent to a single additional via 52 in the second path 50. For example, redundant vias may be inserted globally as described in U.S. Pat. No. 6,026,224 cited above, or by any other prior art method. If, after inserting the additional redundant vias 56, the additional vias 52 all have a corresponding additional redundant via 56, then the single via 30a can optionally be permanently removed from the integrated circuit wiring design (116, see FIG. 7). Additionally, antenna removal may be performed on the net in order to remove any redundant segments 75 (see FIG. 4) of the first wire 10 or second wire 20 of the net between the points where the second path 50 connected into the first wire 10 and the second wire 20. If on the other hand, after inserting the additional redundant vias 56, at least one of the additional vias 52 is still single (i.e., non-redundant), then the single via 30a is unblocked such that the first path 40 and the second path 50 between the first wire 10 and the second wire 20 are redundant (118). Removing the single via 30a and the redundant segment 75 if all of the additional vias 52 are made redundant (at process 116) reduces capacitive loading on the net to which the second path 50 was added, eliminates parallel wire paths which may simplify and speed up net analysis, and generally reduces wire congestion, coupling, and critical wiring area due to removal of unneeded net segments. Furthermore, the process 116 of removing the single via 30a and the redundant segment 75 also reduces the variation between the delay of the net when all vias are successfully manufactured and when one of a pair of redundant vias is defective and fails to make a connection. This is achieved because the length of parallel conductor which must be considered singly or in parallel for maximum and minimum net delay goes from being the length of second path of the net to the distance between adjacent redundant vias. Since this length is smaller, the resistance variation and hence delay variation is smaller.

Figure 9:
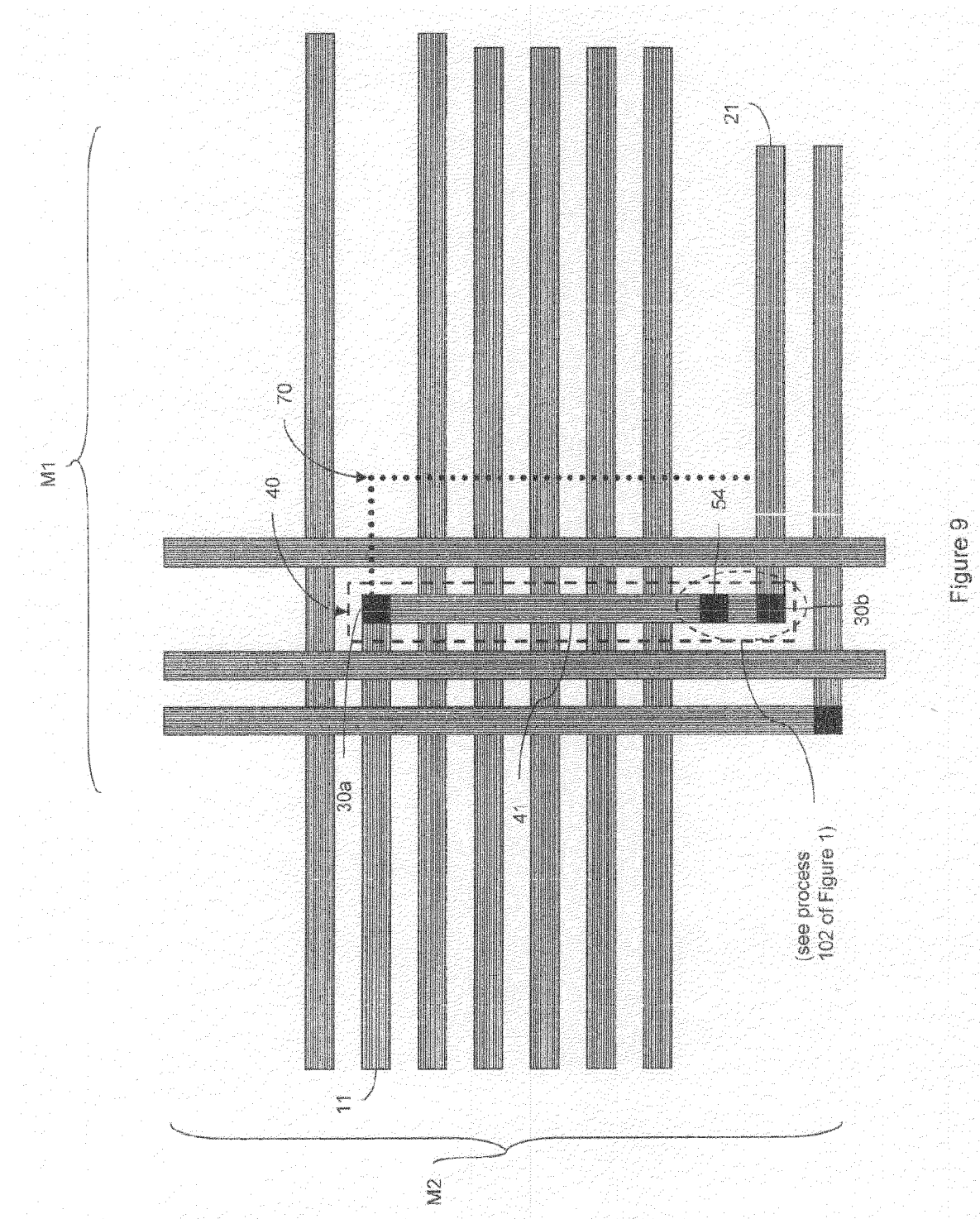
FIG. 9 illustrates a top view of two levels of wiring with a single via in a first path connecting a first wire and a second wire in a same direction.
Figure 10:
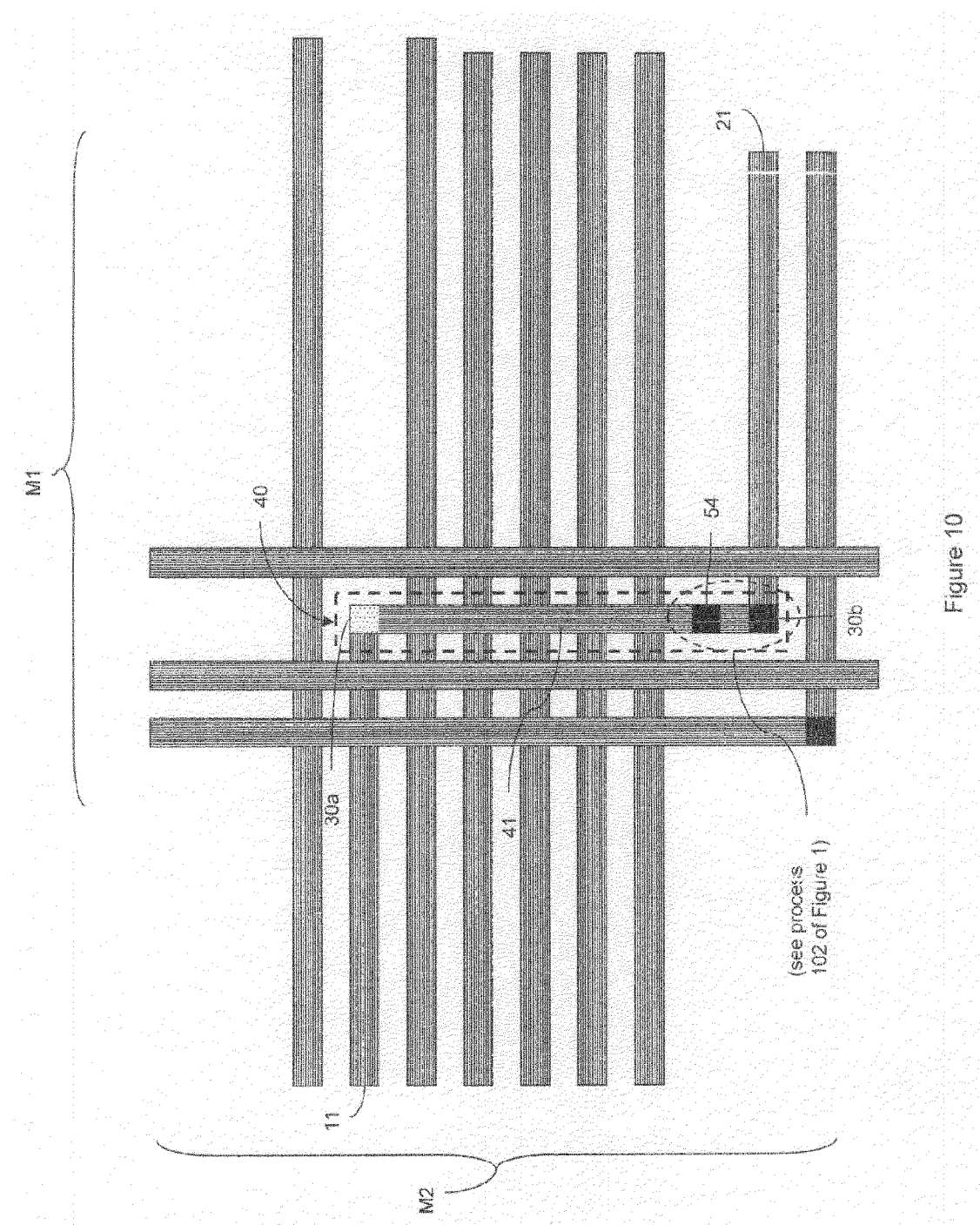
FIG. 10 illustrates FIG. 9 with the single via blocked.
Figure 11:
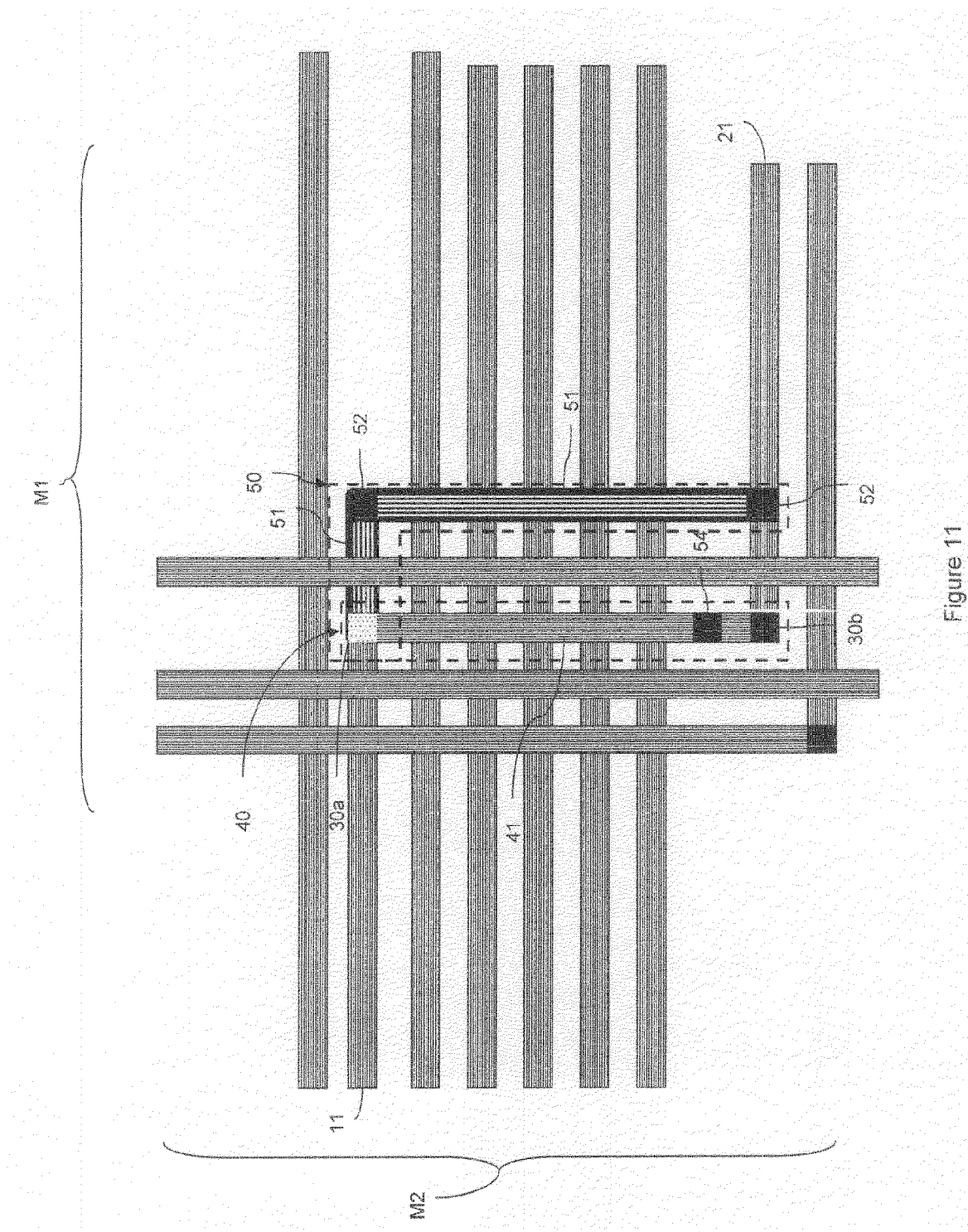
FIG. 11 illustrates FIG. 10 with a second path connecting the first wire and the second wire.
Figure 12:
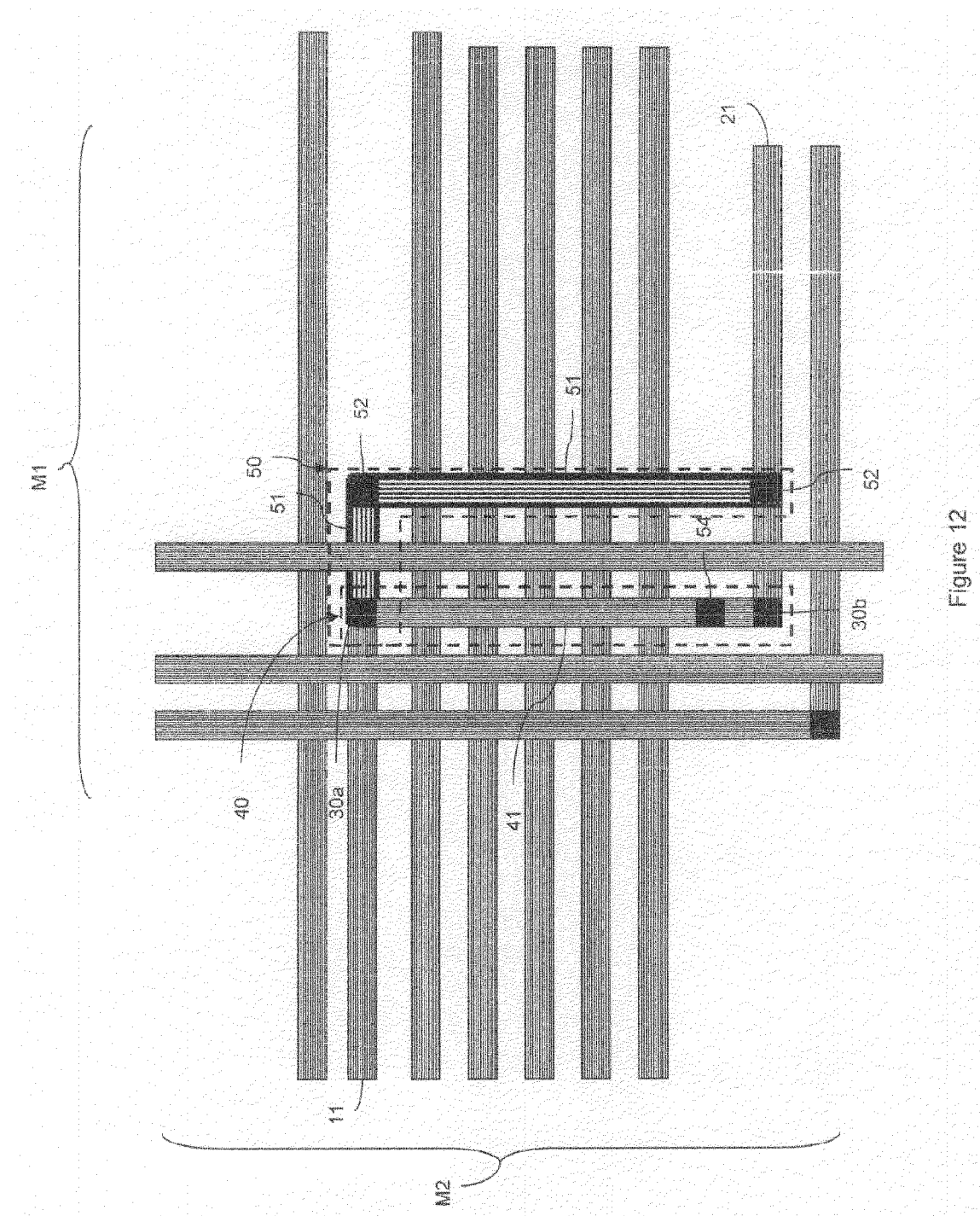
FIG. 12 illustrates FIG. 11 with the single via unblocked.
Figure 13:
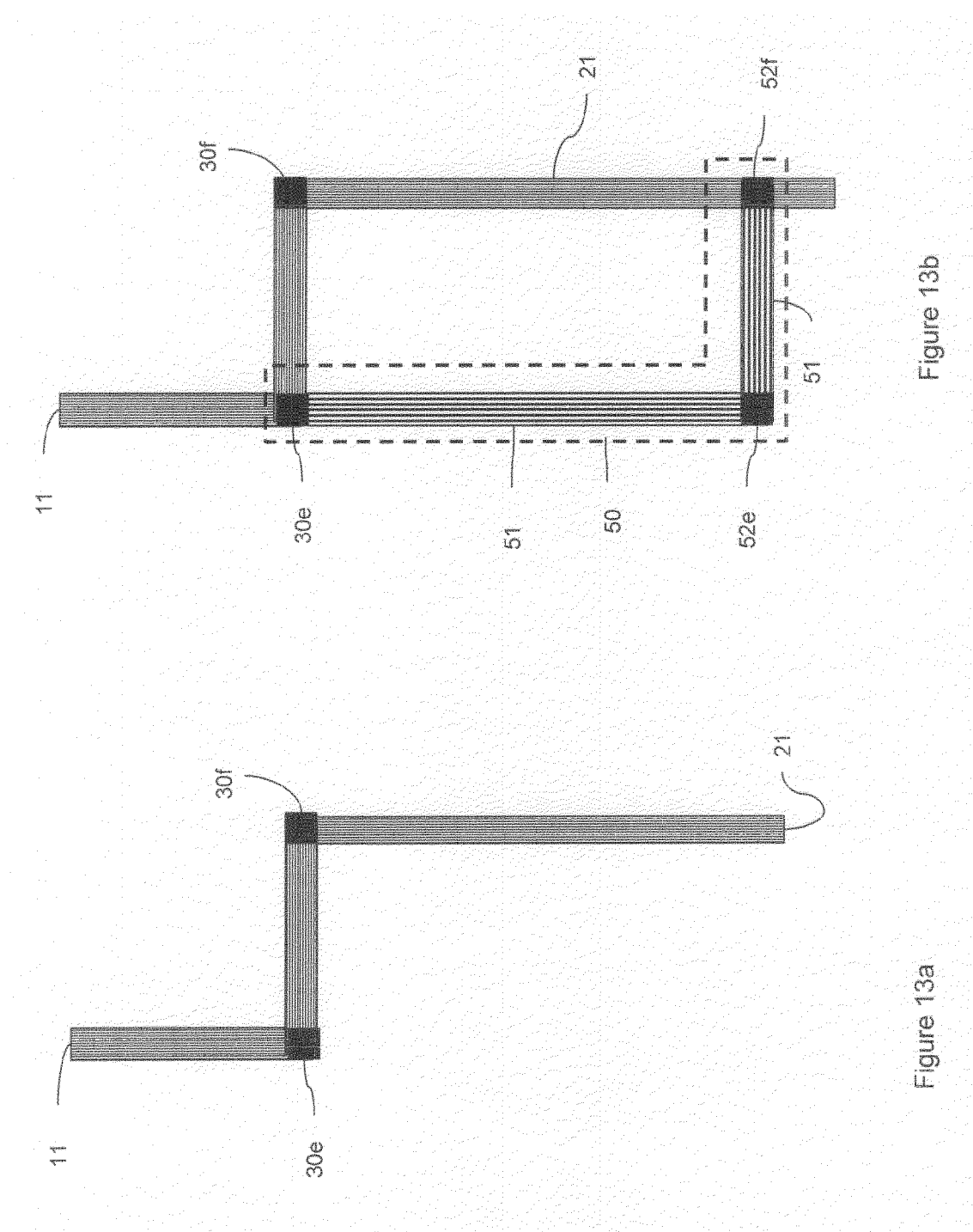
FIGS. 13a-13b illustrate another exemplary embodiment of the method of the invention.

FIGS. 2-8 illustrate the method of the present invention as it applies to a first element 10 (e.g., first wire) on a first layer (e.g., level M1) in a first direction connected to a second element 20 (e.g., second wire) on a second layer (e.g., level M2) in a second direction by way of a single via 30a. As illustrated, the single via 30a comprises the entire first path 40 between the first element 10 and the second element 20. Similarly, FIGS. 9-13a,b illustrate that the same method of the present invention may be applied to connect a first element 11 to a second element 21 when both elements 11, 21 are oriented in the same direction. The wiring and via connections for an integrated circuit are routed using an existing routing program (101, see FIG. 9). Optionally, redundant vias 54 may be inserted wherever possible in an open space adjacent to a single via 30b, (102). Then, single vias 30a, 30b, etc., are identified (104). If the redundant vias 54 are inserted, then the remaining single vias 30a, etc., are necessarily those vias which could not be made redundant because they are located in a congested area. Referring to FIG. 9, the single via 30a comprises a portion of a first path 40 between the first element 11 and the second element 21. The first path 40, as illustrated, also comprises an intra-layer connector 41 (e.g., wire segment) and vias 30b and 54. Then, one at a time individual single vias (e.g., single via 30a, etc.) are targeted for processing. The targeted single via 30a is temporarily blocked, as described above (106, see FIG. 10). Blocking the single via 30a allows the routing program to identify an available route 70 for a second path 50 for connecting the first wire 11 to the second wire 21 (108). The second path 50 is inserted into the available route 70 by the routing program (113, see FIG. 9). The second path 50 comprises a loop with additional via(s) 52 (e.g., the two additional vias of FIG. 11) and additional intra-layer connectors 51 (e.g., the two additional wire segments 51 of FIG. 10) that are used to reconnect the first 11 and second 21 elements in the same direction. Once the second path 50 is inserted at process 113, the single via 30 is unblocked (118, see FIG. 12). Thus, the first element 11 and the second element 21 are connected by both first 40 and second 50 paths (i.e., redundant paths 40 and 50). Note that a single redundant route (i.e., second path 50) may be used to make two single vias redundant. For example, one M1 wire 11 connects to another M1 21 by way of two single vias 30e and 30f (see FIGS. 3a-b). Additional vias 52e and 52f as well as two additional wire segments 51 form the second path 50 making both 30e and 30f redundant. The process is repeated for each single via identified at process 104 and the various limitations and embodiments described above with regard to FIGS. 2-7 would similarly apply.

Although in the examples shown the first and second wires (e.g., first and second elements 10, 20 of FIG. 5 or 11, 21 of FIG. 12) between which a second path 50 is to be constructed are each illustrated as a single rectangle on a single metal level, they should more generally be considered to be the two sets of shapes or structures on all conducting levels of the chip which will remain electrically connected when the blocked via is removed. Consider a case in which a wire W1 connects through via V12 to wire W2, wire W2 connects through via V23 to wire W3, and wire W3 connects through via V34 to wire W4. If a redundant path is to be found for via V23, the first wire would be considered the collection of W1, V12, and W2, and the second wire would be considered the collection of W3, V34, and W4. Thus, the alternative path found by the router might connect W2 to W3, but might also connect W1 to W3, W1 to W4, or W2 to W4, subject to any distance restrictions, as already described. The first (or equivalently, the second) wire may also comprise conducting shapes within one of the circuits to be connected, including polysilicon or diffusion, in which case the via for which a redundant path is to be established is a metal to polysilicon or metal to diffusion contact. The router may then produce an alternative route by connecting the second wire (i.e., any of the shapes comprising the net connecting the circuits) to the circuit in a different location.

Figure 14:
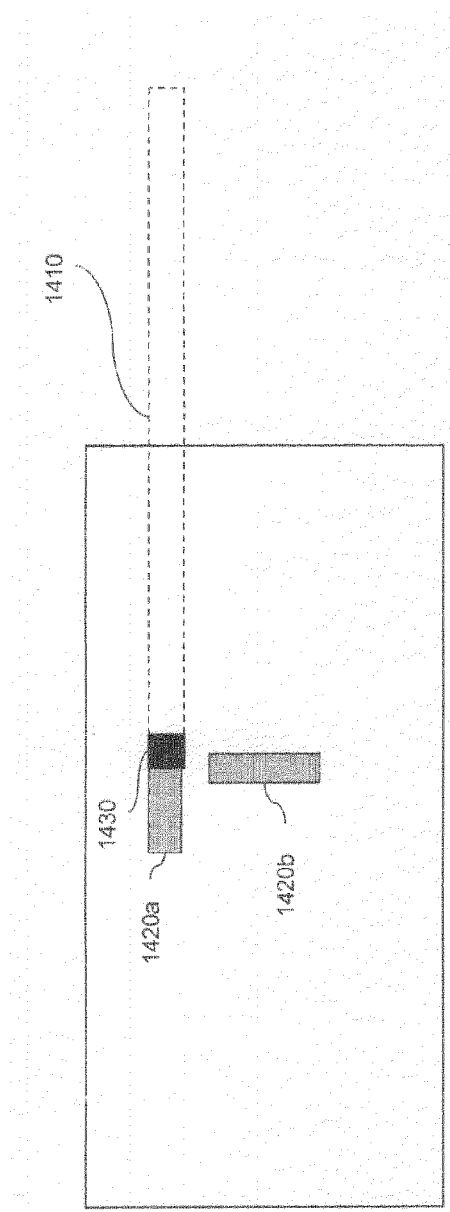
FIGS. 14-16 illustrate another exemplary embodiment of the method of the invention.
Figure 15:
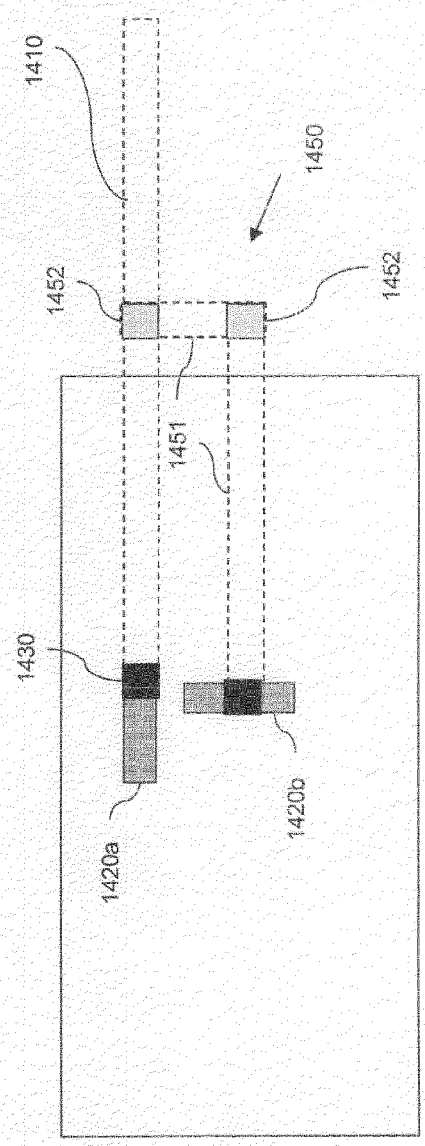
Figure 16:
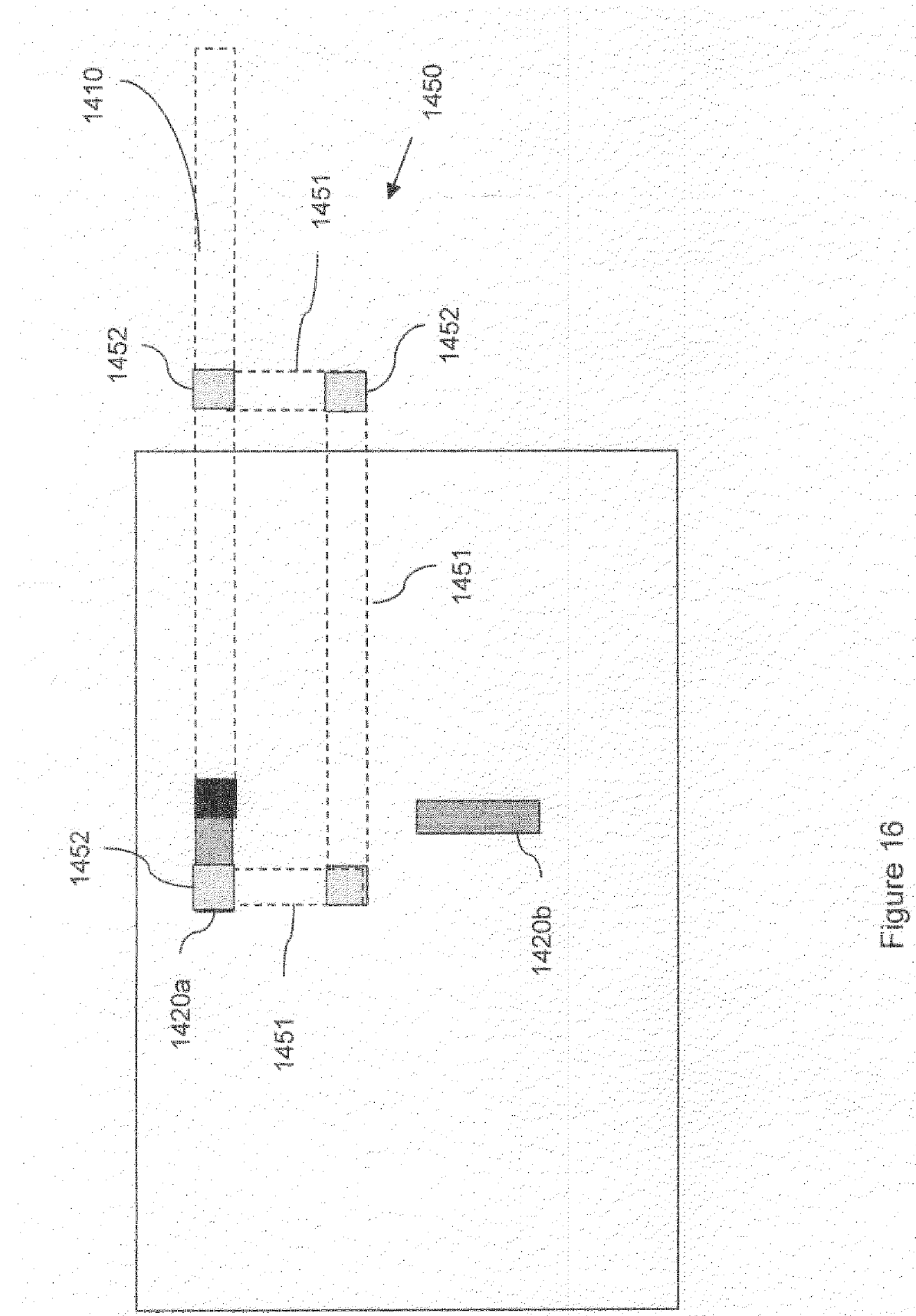

Referring to FIGS. 14-16, it should be noted that wiring connections to circuits are normally constrained to be made only at predefined locations within the circuit, generally referred to as "pins" (e.g., see equivalent pins 1420a-b). For a given connection point, there could be more than one pin or more than one connection with a single pin. A circuit design may provide several equivalent pins 1420a-b which can be connected to a wire 1410 in order to make a particular logical connection between circuits. The pins 1420a-b can be shapes with a special attribute or shapes on a special layer and can be considered first or second elements of the present invention. The method of the present invention can be used to make redundant connections between a wire 1410 and either the same pin or equivalent pins. For example, if an isolated via 1430 connecting a first element (e.g., a wire 1410) to a second element (e.g., pin 1420a) is identified, it can be blocked. Then the routing program can identify an alternate route to the second element (e.g., to an equivalent pin 1420b, see FIG. 15, or to the same pin 1420a, see FIG. 16) and can insert a redundant path 1450, including additional vias 1452 and wire segments 1451. Once a redundant path 1450 between the wire 1410 and either the same 1420a or an equivalent pin 1420b is inserted, the isolated via 1430 can be unblocked.

Figure 17:
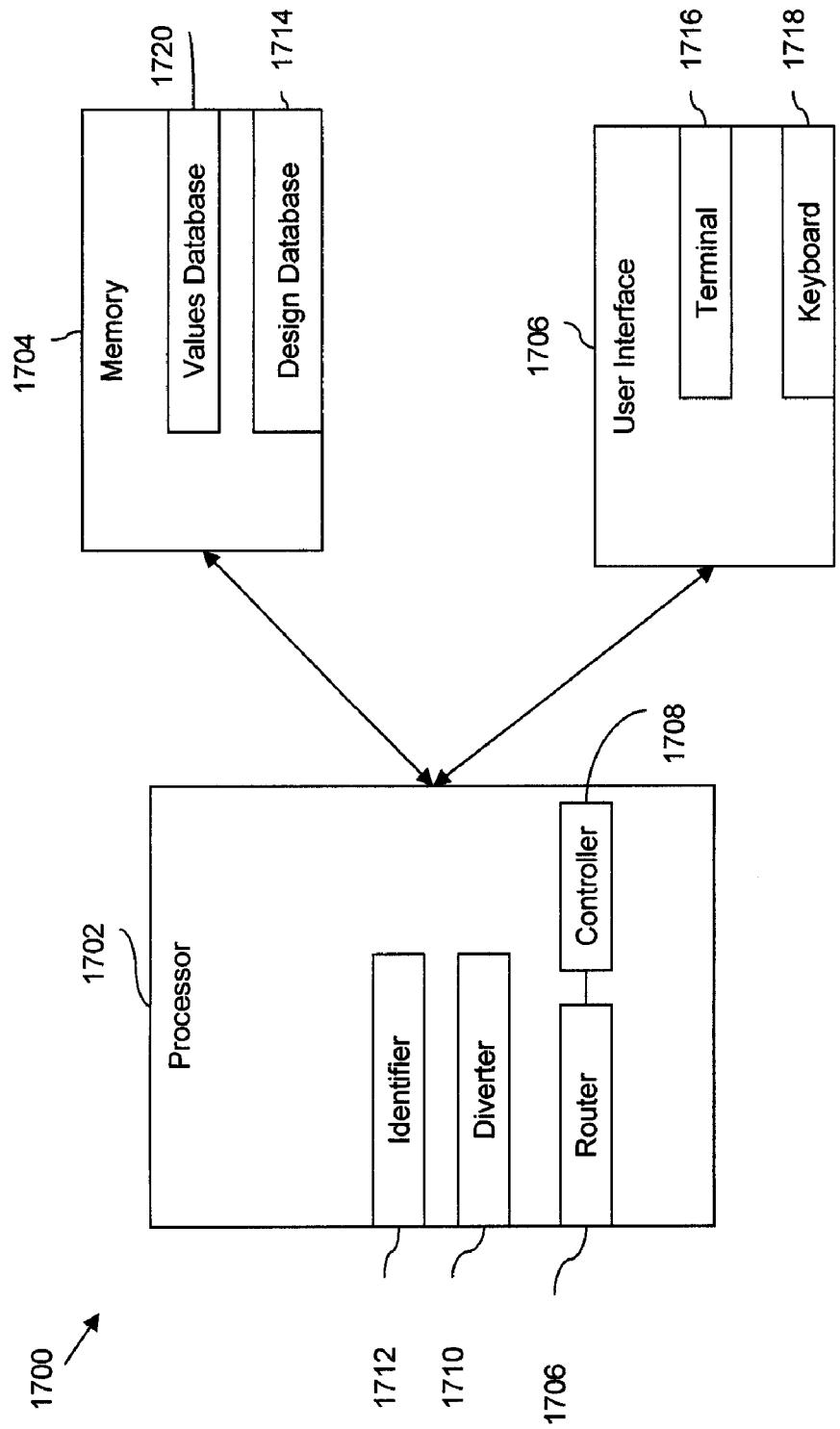
FIG. 17 is a schematic box diagram illustrating a system of the present invention

Referring to FIG. 17, this invention also provides a system 1700 capable of implementing the present invention. The system 1700 comprises a processor 1702, memory 1704 and a user interface 1706. Processor 1702, memory 1704 and user interface 1706 are electrically connected by one of a conventional electrical connection, a wireless connection, an internet connection, etc. The processor 1702 comprises a router 1706, a diverter 1710, an identifier 1712 and a controller 1708. The router 1706 is adapted for routing and inserting intra-layer connectors (e.g., wire segments) and inter-layer connectors (i.e., vias) into integrated circuits. The router 1706 may also be adapted to allow the user to change codes assigned to each via, net, segment, etc. For example, the router 1706 may be adapted to receive a code indicating that the single via is a "must keep" via so that the router 1706 will not remove the single via in order to form another path.

The identifier 1712 is adapted for identifying single vias in previously routed wiring paths (e.g., referring to FIGS. 2 and 9, a single via 30*a* may be identified in first path 40 connected a first wire 10 and a second wire 20). The diverter 1710 is adapted to target a specific single via and to block and unblock the targeted single via, as necessary. Specifically, the diverter 1710 is adapted to mark a targeted single via 30*a* so that it is not recognized by the router 1706 as a connection between a first wire 10 and second wire 20. In other words, the diverter 1710 tricks the router 1706 into proceeding as if the single via 30*a* is not available for use in connecting the first wire 10 to the second wire 20. The diverter 1710 may be adapted to either functionally block the single via 30*a* or to switch the single via 30*a* to another net, such as a dummy net. The router 1706 is further adapted to determine if an alternate route 70 is available for connecting a first wire 10 and a second wire 20 when the single via 30*a* is blocked and, if such an alternate route 70 is available, for inserting a second path 50 into the alternate route 70. The second path 50 can comprise additional vias 52 and additional intra layer connections (e.g., wire segments) 51. The diverter 1710 is further adapted for unblocking the previously blocked targeted single via 30*a* once a second path 50 is inserted into the integrated circuit wiring such that the first path 40 and the second path 50 provide redundant paths between the first wire 10 and the second wire 20. The controller 1708 controls the router 1706 by restricting the second path 50 which may be used. For example, the controller 1708 may be adapted to restrict the second path 50 to an area between and within the layers (e.g., between metal layers M1, M2 used by the first path 40) and to no greater than a predetermined distance 13 from the single via 30*a*. The controller 1708 may also restrict the router 1706 from ripping up existing vias (e.g., 30*c*, 30*b*, etc.) in order to form the second path 50. Additionally, the controller 1708 may be adapted to conduct a cost-benefit analysis and to only insert the second path 50 if a benefit of inserting the second path 50 outweighs a cost of inserting the second path 50. Memory 1704 comprises a wiring schematic database 1714 that comprises data representing a previously routed integrated circuit schematic and is accessible by the router 1706. Memory 1704 further comprises a cost-benefit values database 1720 which comprises critical area data, defect density vector data, systematic yield fallout data, etc., that is accessible by said controller 1708 when conducting said cost-benefit analysis. User Interface 1706 comprises a terminal 1716 and a keyboard or other user interface device 1718 and is adapted for monitoring and/or controlling the processor 1702.

Accordingly, the invention provides a method for increasing redundancy in routed very large scale integration (VLSI) designs in order to enhance circuit yield and reliability and a system for implementing the method. While manufacturing defects may still occur using the present invention, adding redundancy decreases the probability that such a manufacturing defect will cause a failure in the integrated circuit. The invention provides a method for inserting redundant paths into integrated circuits. Particularly, the invention provides a method for identifying and targeting a single via in a first path connecting two elements (e.g., wires, devices, etc.), determining if an alternate route (other than a redundant via adjacent to the single via) is available for connecting the two elements, and for inserting a second path into the available alternate route. The combination of the first and second paths provides greater redundancy than inserting a redundant via alone. More importantly, such redundant paths provide for redundancy when congestion prevents a redundant via from being inserted adjacent to the single via at all. An embodiment of the method further comprises removing the single via and any redundant wire segments, if all of the additional vias used to form the second path can be made redundant. While this invention has been described in terms of embodiments, those skilled in the art will recognize that the invention can be practiced with modification within the spirit and scope of the appended claims.

What is claimed is:

1. An automated method for reducing design sensitivity to manufacturing defects and increasing reliability in integrated circuit connections, said method comprising:

blocking a single via in a first path connecting a first element and a second element;

identifying an available alternate route between said first element and said second element;

inserting a second path, having at least an additional via and an additional intra-layer connector, into said available alternate route; and unblocking said single via to form redundant paths between said first element and said second element.

2. The method of claim 1, further comprising only inserting said second path if said available alternate route is within and between metal layers used by said first path.

3. The method of claim 1, further comprising only inserting said second path if said available alternate route is located in at least one of inside a predetermined distance from said single and outside a second predetermined distance from said single via.

4. The method of claim 1, further comprising only inserting said second path if previously existing vias are maintained.

5. The method of claim 1 wherein said inserting of said second path comprises using a different wire code in a wiring database than a wire code used in said wiring database for said first path.

6. The method of claim 1, further comprising before said inserting of said second path, conducting a cost-benefit analysis to determine if a benefit of said inserting of said second path outweighs a cost of said inserting of said second path; and only inserting said second path if said benefit outweighs said cost.

7. The method of claim 6, wherein said conducting of said cost-benefit analysis comprises:

estimating a benefits value of avoiding of a random defect caused by a potential fault in said single via and of reducing of an open circuit fault critical area;

estimating a costs value of increasing of a short circuit fault critical area; and comparing said costs value to said benefits value.

8. The method of claim 7, wherein said estimating of said benefits value comprises:

estimating said open circuit fault critical area;

determining a value of said reducing of said open circuit fault critical area by:

measuring a length of redundancy which will be created by said second path;

subtracting said length of redundancy from said open circuit fault critical area; and applying a predetermined defect density multiplication factor;

determining a value of said avoiding of said random defect by multiplying said open circuit fault critical area for said single via by a predetermined defect density multiplication factor; and adding said value of said reducing of said open circuit fault critical area to said value of said avoiding of said random defect.

9. The method of claim 7, wherein said estimating of said costs value comprises:
measuring a length of adjacency between wire segments of said second path and previously existing wire segments adding said length of adjacency to said short circuit fault critical area;
adding said length of adjacency to said short circuit critical area; and
applying a predetermined defect density multiplication factor.

10. The method of claim 1, wherein each of said first and second elements comprise at least one of a pin, a wire and device.

11. The method of claim 1, further comprising:
after said inserting of said second path, inserting additional redundant vias corresponding to said additional vias at available locations in said second path; and
if, after said inserting of said additional redundant vias, each of said additional vias in said second path has a corresponding additional redundant via, then permanently removing said single via from said integrated circuit connections instead of unblocking said single via.

12. An automated method for reducing design sensitivity to manufacturing defects and increasing reliability in integrated circuit connections, said method comprising:
inserting redundant vias at available locations in said integrated circuit wiring;
after said inserting of said redundant vias, blocking a single via connecting a first element to a second element;
identifying an available alternate route between said first element and said second element;
inserting a second path, having at least an additional via and an additional intra-layer connector, into said available alternate route; and
unblocking said single via such that redundant paths are formed between said first element and said second element.

13. The method of claim 12, further comprising only inserting said second path if said available alternate route is within and between metal layers used by said first path.

14. The method of claim 12, further comprising only inserting said second path if said available alternate route is located in at least one of inside a predetermined distance from said single and outside a second predetermined distance from said single via.

15. The method of claim 12, further comprising only inserting said second path if previously existing vias are maintained.

16. The method of claim 12, wherein said inserting of said second path comprises using a different wire code in a wiring database than a wire code used in said wiring database for said first path.

17. The method of claim 12, further comprising before said inserting of said second path, conducting a cost-benefit analysis to determine if a benefit of said inserting of said second path outweighs a cost of said inserting of said second path; and only inserting said second path if said benefit outweighs said cost.

18. The method of claim 17, wherein said conducting of said cost-benefit analysis comprises:

estimating a benefits value of avoiding of a random defect caused by a potential fault in said single via and of reducing of an open circuit fault critical area;
estimating a costs value of increasing of a short circuit fault critical area; and
comparing said costs value to said benefits value.

19. The method of claim 18, wherein said estimating of said benefits value comprises:
estimating said open circuit fault critical area;
determining a value of said reducing of said open circuit fault critical area by:
measuring a length of redundancy which will be created by said second path;
subtracting said length of said redundancy from said open circuit fault critical area; and
applying a predetermined defect density multiplication factor;
determining a value of said avoiding of said random defect by multiplying said open circuit fault critical area for said single via by a predetermined defect density multiplication factor; and
adding said value of said reducing of said open circuit fault critical area to said value of said avoiding of said random defect.

20. The method of claim 18, wherein said estimating of said costs value comprises:
measuring a length of adjacency between wire segments of said second path and previously existing wire segments adding said length of adjacency to said short circuit fault critical area;
adding said length of adjacency to said short circuit critical area; and
applying a predetermined defect density multiplication factor.

21. The method of claim 12, wherein each of said first and second elements comprise at least one of a pin, a wire, and a device.

22. The method of claim 12, further comprising:
after said inserting of said second path, inserting additional redundant vias corresponding to said additional vias at available locations in said second path; and
if, after said inserting of said additional redundant vias, each of said additional vias in said second path has a corresponding additional redundant via, then permanently removing said single via from said integrated circuit connections instead of unblocking said single via.

23. An automated method for reducing design sensitivity to manufacturing defects and increasing reliability in integrated circuit connections, said method comprising:
placing a first predetermined cost on retaining a single via in a first path connecting a first element and a second element,
placing a second predetermined cost on creating each additional via for an alternate route between said first element and said second element;
identifying an available alternate route between said first element and said second element; and
inserting a second path into said available alternate route only if a sum of said second predetermined costs is less than said first predetermined cost.

24. The method of claim 23, further comprising only inserting said second path if said available alternate route is within and between metal layers used by said first path.

25. The method of claim 23, further comprising only inserting said second path if said available alternate route is located in at least one of inside a predetermined distance from said single and outside a second predetermined distance from said single via.

26. The method of claim 23, wherein said inserting of said second path comprises using a different wire code in a wiring database than a wire code used in said wiring database for said first path.

27. The method of claim 23, wherein said first and second elements comprise at least one of pins, wires and devices.

28. A program storage device readable by a machine, tangibly embodying a program of instructions executable by said machine to perform a method for reducing design sensitivity to manufacturing defects and increasing reliability in integrated circuit connections, said method comprising:
blocking a single via connecting a first element to a second element;
identifying an available alternate route between said first element and said second element;
inserting a second path, having at least an additional via and an additional intra-layer connector, into said available alternate route; and
unblocking said single via so as to form redundant paths between said first element and said second element.

29. The program storage device of claim 28, wherein said method further comprises only inserting said second path if said available alternate route is within and between metal layers used by said first path.

30. The program storage device of claim 28, wherein said method further comprises only inserting said second path if said available alternate route is located within a predetermined distance from said single.

31. The program storage device of claim 28, wherein said method further comprises only inserting said second path if previously existing vias are maintained.

32. The program storage device of claim 28, wherein said inserting of said second path comprises using a different wire code in a wiring database than a wire code used in said wiring database for said first path.

33. The program storage device of claim 28, wherein said method further comprises before said inserting of said second path, conducting a cost-benefit analysis to determine if a benefit of said inserting of said second path outweighs a cost of said inserting of said second path; and only inserting said second path if said benefit outweighs said cost.

34. The program storage device of claim 33, wherein said conducting of said cost-benefit analysis comprises:
estimating a benefits value of avoiding of a random defect caused by a potential fault in said single via and of reducing of an open circuit fault critical area;
estimating a costs value of increasing of a short circuit fault critical area; and
comparing said costs value to said benefits value.

35. The program storage device of claim 34, wherein said estimating of said benefits value comprises:
estimating said open circuit fault critical area;
determining a value of said reducing of said open circuit fault critical area by:
measuring a length of redundancy which will be created by said second path;
subtracting said length of said redundancy from said open circuit fault critical area; and
applying a predetermined defect density multiplication factor;
determining a value of said avoiding of said random defect by multiplying said open circuit fault critical area for said single via by a predetermined defect density multiplication factor; and
adding said value of said reducing of said open circuit fault critical area to said value of said avoiding of said random defect.

36. The program storage device of claim 34, wherein said estimating of said costs value comprises:
measuring a length of adjacency between wire segments of said second path and previously existing wire segments adding said length of adjacency to said short circuit fault critical area;
adding said length of adjacency to said short circuit critical area; and
applying a predetermined defect density multiplication factor.

37. A system for reducing design sensitivity to manufacturing defects and increasing reliability in integrated circuit connections, said system comprising:
an identifier for identifying a single via in a first path connecting a first element and a second element, wherein said single via comprises a single via used to make an interlayer connection;
a router for identifying an available alternate route for a second path between said first element and said second element and for inserting at least an additional via and an additional intra-layer connector into said available route to form said second path; and
a diverter adapted for blocking said single via so that said router may identify said alternate route and for unblocking said single via after said second path is inserted so that said first path and said second path provide redundant paths between said first element and said second element.

38. The system of claim 37, wherein said system further comprises a controller for controlling said router by restricting said second path within predetermined limits.

39. The system of claim 37, wherein said controller is adapted to restrict said second path to at least one of within and between metal layers used by said first path, within a predetermined distance from said single via, and outside previously existing vias.

40. The system of claim 37, wherein said controller is adapted to conduct a cost-benefit analysis of inserting said second path and to only insert said second path if a benefit of said second path outweighs a cost of said second path.

* * * * *